United States Patent
Chiu et al.

(10) Patent No.: US 6,600,227 B1
(45) Date of Patent: Jul. 29, 2003

(54) SYSTEM AND METHOD FOR PROVIDING MECHANICAL PLANARIZATION OF A SEQUENTIAL BUILD UP SUBSTRATE FOR AN INTEGRATED CIRCUIT PACKAGE

(75) Inventors: Anthony M. Chiu, Richardson, TX (US); Harry Michael Siegel, Hurst, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/066,422

(22) Filed: Jan. 31, 2002

(51) Int. Cl.⁷ ............................................... H01L 23/45
(52) U.S. Cl. ..................... 257/752; 257/750; 257/758
(58) Field of Search ............................. 257/752, 750, 257/758; 438/652, 626, 631, 645, 118, 622

(56) References Cited

U.S. PATENT DOCUMENTS

| | | | | |
|---|---|---|---|---|
| 4,634,496 A | * | 1/1987 | Mase et al. ............... | 438/631 |
| 5,508,233 A | * | 4/1996 | Yost et al. ............... | 438/631 |
| 5,798,298 A | * | 8/1998 | Yang et al. ............... | 438/622 |
| 5,821,621 A | * | 10/1998 | Jeng ............................ | 257/759 |
| 5,861,342 A | * | 1/1999 | Gabriel et al. ............ | 438/631 |
| 6,034,434 A | * | 3/2000 | Bothra et al. ............. | 257/758 |
| 6,080,652 A | * | 6/2000 | Yamaha et al. ............ | 438/622 |
| 6,093,637 A | * | 7/2000 | Kishimoto et al. ......... | 438/624 |
| 6,130,149 A | * | 10/2000 | Chien et al. ............... | 438/613 |
| 6,218,284 B1 | * | 4/2001 | Liu et al. .................. | 438/624 |
| 6,274,933 B1 | * | 8/2001 | Abdelgadir et al. ........ | 257/758 |
| 6,294,456 B1 | * | 9/2001 | Lee et al. .................. | 438/623 |
| 6,396,089 B1 | * | 5/2002 | Lin et al. ................... | 257/225 |
| 6,403,385 B1 | * | 6/2002 | Venkatkrishnan et al. .... | 438/14 |

FOREIGN PATENT DOCUMENTS

JP  63-240045  * 10/1988  ................. 257/752

* cited by examiner

Primary Examiner—Jasmine J B Clark
(74) Attorney, Agent, or Firm—Lisa K. Jorgenson; William A. Munck (57) ABSTRACT

A system and method is disclosed for providing mechanical planarization of a sequential build up substrate for an integrated circuit package. A planarization plate is placed in contact with an uneven external surface of a dielectric layer that covers underlying functional circuit elements and filler circuit elements. A heating element in the planarization plate flattens protruding portions of the external surface of the dielectric layer to create a flat external surface on the dielectric layer. After the flat external surface of the dielectric layer has cooled, it is then covered with a metal conductor layer. The method of the present invention increases the number of sequential build up layers that may be placed on a sequential build up substrate.

21 Claims, 7 Drawing Sheets

FIGURE 7

SYSTEM AND METHOD FOR PROVIDING MECHANICAL PLANARIZATION OF A SEQUENTIAL BUILD UP SUBSTRATE FOR AN INTEGRATED CIRCUIT PACKAGE

TECHNICAL FIELD OF THE INVENTION

The present invention is directed, in general, to substrates for integrated circuit packages and, more specifically, to a system and method for providing mechanical planarization of a sequential build up substrate used in the packaging of a semiconductor device.

BACKGROUND OF THE INVENTION

Modern semiconductor devices are small in size and may have more than one thousand pins. The most common form of package for such devices is the ball grid array (BGA). The ball grid array package style comprises a substrate made of fiberglass material, an integrated circuit made of silicon, and a protective material to protect the electrical connections between the integrated circuit and the substrate.

Figure 1:
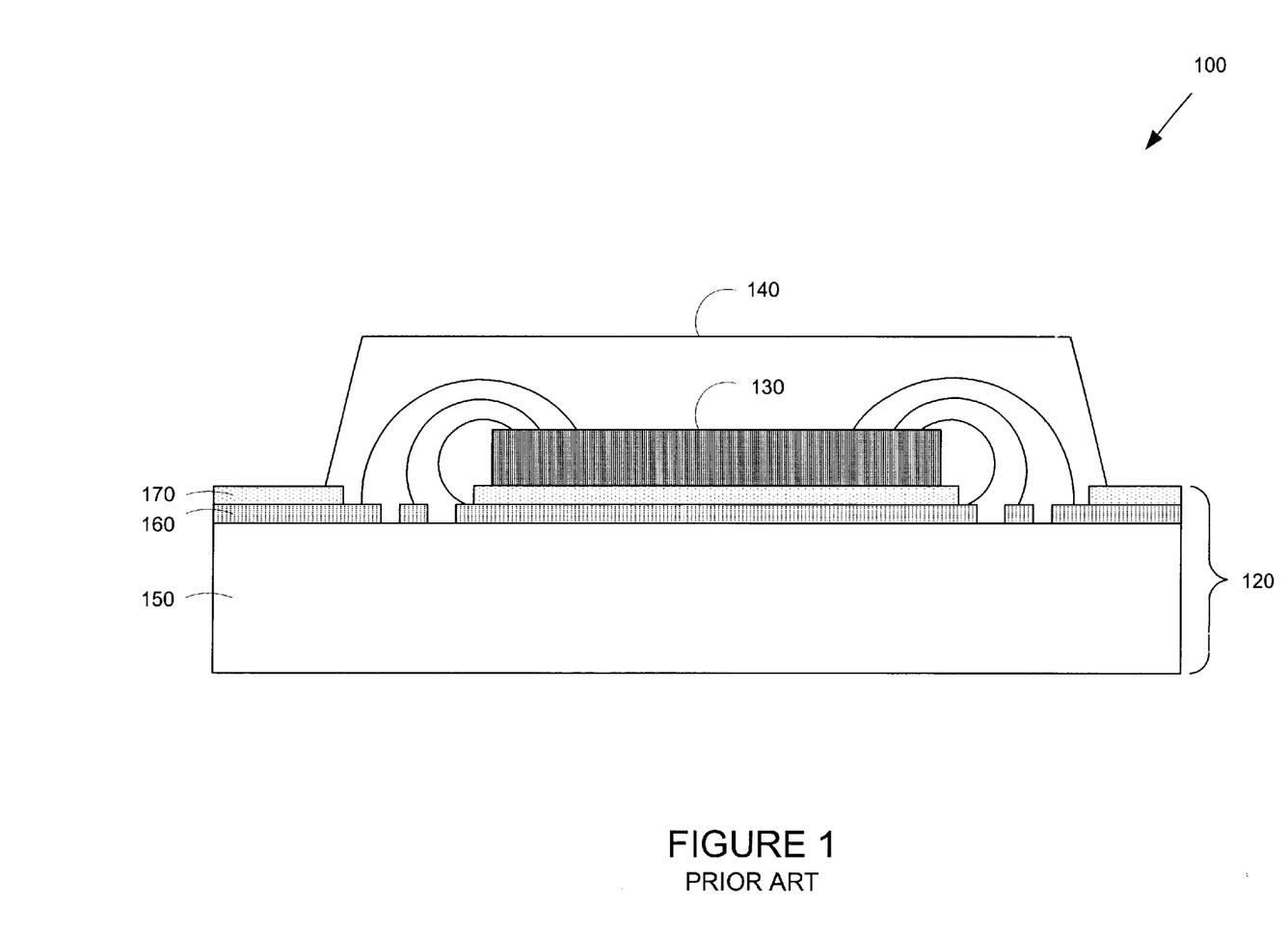
FIG. 1 illustrates a sectional side view of an exemplary prior art integrated circuit package.

FIG. 1 illustrates a sectional side view of an exemplary prior art integrated circuit package 100. Integrated circuit package 100 comprises substrate 120, integrated circuit 130, and protective material 140. Substrate 120 comprises core layer 150, metal layer 160, and dielectric layer 170. As shown in FIG. 1, electrical leads 180 connect integrated circuit 130 with metal layer 160.

"Sequential build up" is a term used to describe a method of making a multi-layered substrate by sequentially plating layers of metal conductor and layers of dielectric material over a core layer. The sequential build up method is used to make substrates having conductor lines of very small width (e.g., twenty microns (20 µm) to fifty microns (50 µm) in width). Sequential build up substrates are used with integrated circuits that require high density routing.

Figure 2:
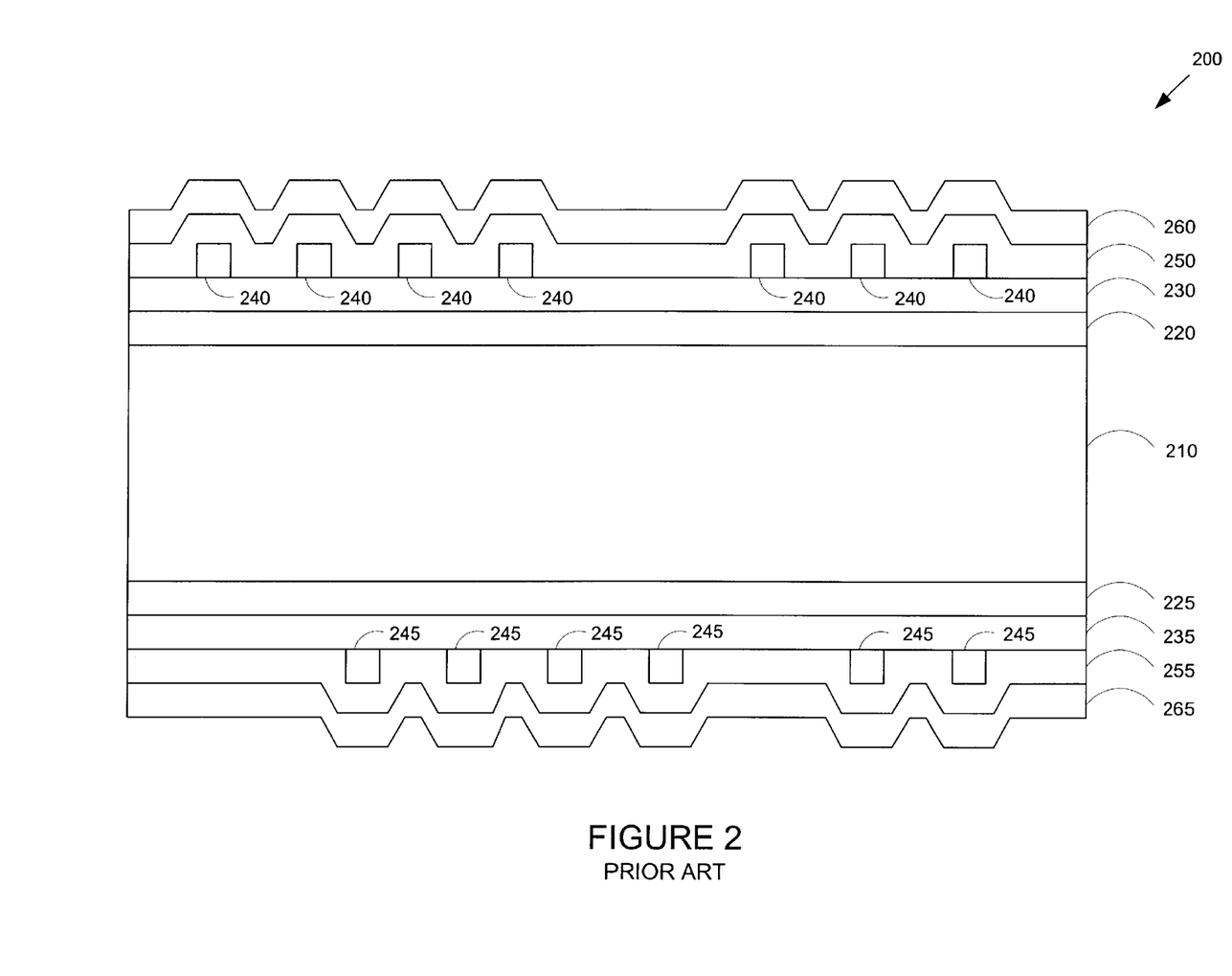
FIG. 2 illustrates a sectional side view of an exemplary prior art sequential buildup substrate in which the sequential buildup substrate has uneven external surfaces due to the application of a prior art sequential build up method.

FIG. 2 illustrates a sectional side view of an exemplary prior art sequential build up (SBU) substrate 200. SBU substrate 200 comprises an underlying core substrate 210. A conventional lamination process is used to place first metal conductor layers 220 and 225 on core substrate 210. First metal conductor layers 220 and 225 form the power or ground planes of substrate 200. First dielectric layers 230 and 235 are applied by screening or roller on the first metal conductor layers 220 and 225. Circuit elements 240 and 245 (e.g., conductor lines 240 and 245) are then placed on first dielectric layers 230 and 235 using a prior art metal plate, pattern and etch process. The circuit elements 240 and 245 are then covered with second dielectric layers 250 and 255. These layers are usually done in pairs as top and bottom layers for efficiency. However, the layers can also be built one side at a time.

As shown in FIG. 2, the external surface of second dielectric layers 250 and 255 that cover circuit elements 240 and 245 are not flat. Consequently, the external surfaces of third metal conductor layers 260 and 265 that are placed over second dielectric layers 250 and 255 are also not flat. This makes it difficult to make precise images on the external surface of third metal conductor layers 260 and 265. As a result of the presence of uneven surfaces of second dielectric layers 250 and 255 and of third metal conductor layers 260 and 265, substrates that are created by the "sequential build up" method are limited to two or three metal buildup layers.

It would be desirable to have a system and method for creating flat surfaces in "sequential build up" layers. For example, if second dielectric layers 250 and 255 and third metal conductor layers 260 and 265 had flat surfaces, then it would not be difficult to make precise images on the flat external surfaces of third metal conductor layers 260 and 265. If "sequential build up" layers could be constructed with flat surfaces, then the "sequential build up" method would not be limited to two or three metal buildup layers.

There is a need in the art for an improved system and method for providing mechanical planarization of a sequential build up substrate for an integrated circuit package.

There is a need in the art for an improved system and method for increasing the number of sequential buildup layers that may be placed on a substrate for an integrated circuit package.

SUMMARY OF THE INVENTION

To address the deficiencies of the prior art, it is a primary object of the present invention to provide a system and method for providing mechanical planarization of a sequential build up substrate for an integrated circuit package.

The present invention comprises an improved system and method for manufacturing a substrate for an integrated circuit package. Circuit elements are placed on a first dielectric layer of a substrate using a prior art metal plate, pattern and etch process. Then filler circuit elements are placed between functional circuit elements on the first dielectric layer of the substrate. A second dielectric layer is then placed over the functional circuit elements and the filler circuit elements and the first dielectric layer. A planarization plate with a heating element is then placed in contact with the uneven external surface of the second dielectric layer before it is cured. The planarization plate with a heating element is pressed onto the uneven portions of the external surface of the second dielectric layer to create a flat external surface on the second dielectric layer. Then, continued heating causes the dielectric layer to cure and harden. After the flat external surface of the second dielectric layer has cooled, it is then covered with a metal conductor layer. Because the external surface of the second dielectric layer is flat, the external surface of the metal conductor layer that covers it will also be flat. The improved flatness of the second dielectric layer and consequently the improved flatness of the associated metal conductor layer permits more layers to be added before a critical cumulative surface roughness is reached which prevents the accurate photoimaging that is required to produce high quality sequential build up substrates.

It is an object of the present invention to provide an improved system and method for providing mechanical planarization of a sequential build up substrate for an integrated circuit package.

It is also an object of the present invention to provide an improved system and method for increasing the number of sequential build up layers that may be placed on a substrate for an integrated circuit package.

It is another object of the present invention to provide an improved system and method for creating dielectric layers in a substrate that have a flat external surface.

It is another object of the present invention to provide an improved system and method for heating an uneven surface of a dielectric layer during the manufacture of a substrate to flatten portions of the uneven surface of the dielectric layer in order to create a flat external surface on the dielectric layer.

It is yet another object of the present invention to provide an improved system and method for controlling the thickness of a dielectric layer during the manufacture of a substrate when a flat external surface on the dielectric layer is created.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged sequential buildup substrate.

FIG. 1 illustrates a sectional side view of an exemplary prior art integrated circuit package 100. Integrated circuit package 100 comprises substrate 120, integrated circuit 130, and protective material 140. Substrate 120 comprises core layer substrate 150, metal substrate layer 160, and dielectric substrate layer 170. As shown in FIG. 1, electrical leads 180 connect integrated circuit 130 with metal layer substrate 160.

FIG. 2 illustrates a sectional side view of an exemplary prior art sequential build up (SBU) substrate 200. SBU substrate 200 comprises an underlying core substrate 210. A conventional lamination process is used to place first metal conductor layer 220 on core substrate 210. First metal conductor layer 220 forms the power or ground plane for this side of substrate 200. A conventional lamination process is used to place a first dielectric layer 230 on the first metal conductor layer 220. Circuit elements 240 (e.g., conductor lines 240) are then placed on first dielectric layer 230 using a prior art metal plate, pattern and etch process. The circuit elements 240 are then covered with a second dielectric layer 250.

As shown in FIG. 2, the external surface of second dielectric layer 250 that covers circuit elements 240 is not flat. Consequently, the external surface of third metal conductor layer 260 that is placed over the second dielectric layer 150 is also not flat. This makes it difficult to make precise images on the external surface of third metal conductor layer 260. As a result of the presence of uneven surfaces of second dielectric layer 250 and of third metal conductor layer 260, substrates that are created by the "sequential build up" method are limited to two or three metal build up layers.

As also shown in FIG. 2, a conventional lamination process may be used to place metal conductor layers and dielectric layers on a second side of SBU substrate 200. In particular, a conventional lamination process is used to place first metal conductor layer 225 on core substrate 210. First metal conductor layer 225 forms the power or ground plane for this side of substrate 200. A conventional lamination process is used to place a first dielectric layer 235 on the first metal conductor layer 225. Circuit elements 245 (e.g., conductor lines 245) are then placed on first dielectric layer 235 using a prior art metal plate, pattern and etch process. The circuit elements 245 are then covered with a second dielectric layer 255.

As shown in FIG. 2, the external surface of second dielectric layer 255 that covers circuit elements 245 is not flat. Consequently, the external surface of third metal conductor layer 265 that is placed over second dielectric layer 255 is also not flat. This makes it difficult to make precise images on the external surface of third metal conductor layer 265. As a result of the presence of uneven surfaces of second dielectric layer 255 and of third metal conductor layer 265, substrates that are created by the "sequential build up" method are limited to two or three metal buildup layers.

Figure 3:
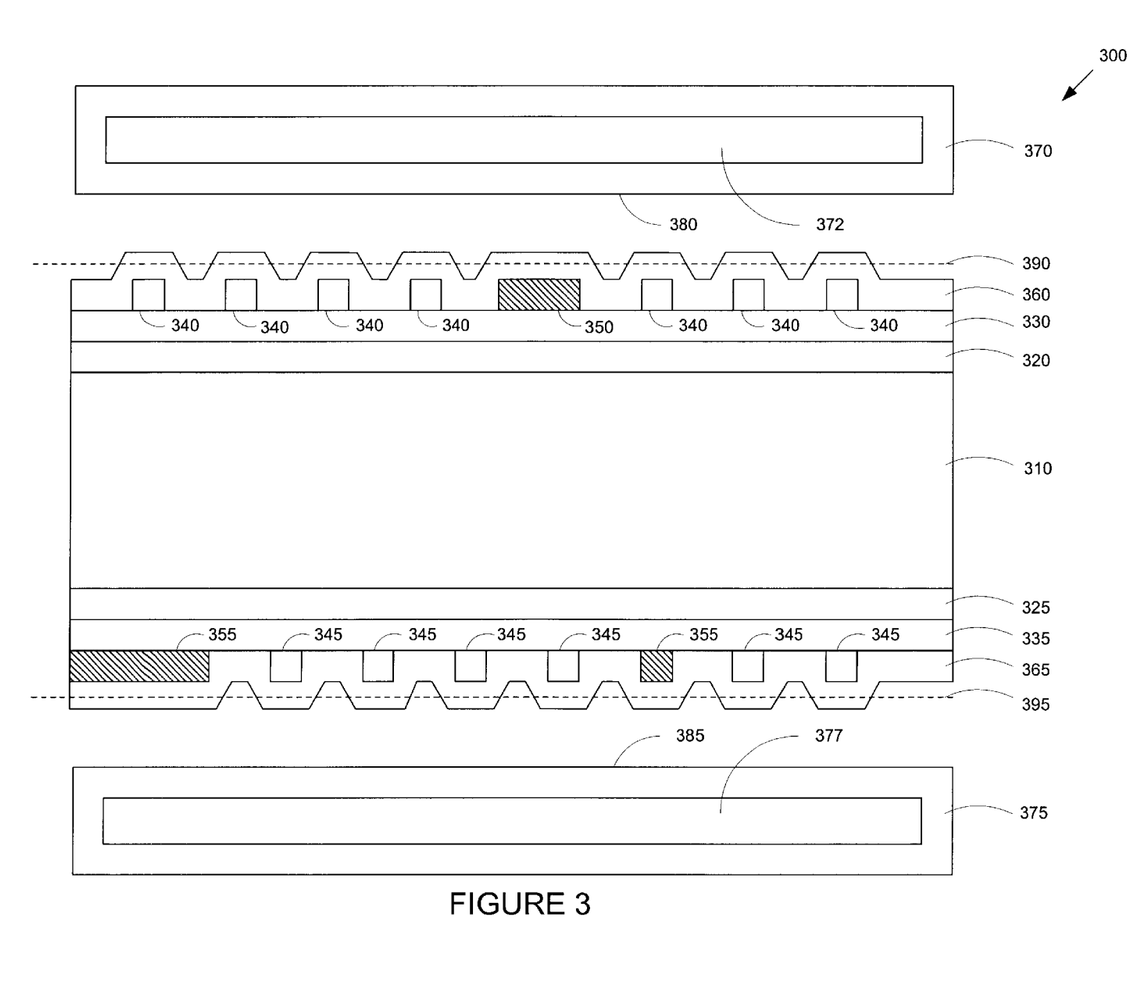
FIG. 3 illustrates a sectional side view of an advantageous embodiment of a sequential buildup substrate of the present invention showing filler circuit elements placed between functional circuit elements of the substrate and showing planarization plates for creating flat external surfaces on the substrate.

FIG. 3 illustrates a sectional side view of an exemplary SBU substrate 300 of the present invention. SBU substrate 300 comprises an underlying core substrate 310. A sequential build up process is used to place first metal conductor layer 320 on core substrate 310 and to place a first dielectric layer 330 on the first metal conductor layer 320. Similarly, on the other side of SBU substrate 300, a sequential build up process is used to place first metal conductor layer 325 on core substrate 310 and to place a first dielectric layer 335 on the first metal conductor layer 325.

Functional circuit elements 340 (e.g., conductor lines 340) and filler circuit elements 350 are placed on first dielectric layer 330 using a prior art metal plate, pattern and etch process. Filler circuit elements 350 are placed on first dielectric layer 330 between functional circuit elements 340. The functional circuit elements 340 and the filler circuit elements 350 on first dielectric layer 330 are then covered with a second dielectric layer 360. Filler circuit elements 350 provide support for second dielectric layer 360 in areas in which functional circuit elements 340 are not present.

Similarly, circuit elements 345 (e.g., conductor lines 345) and filler circuit elements 355 are placed on first dielectric layer 335 using a prior art metal plate, pattern and etch process. Filler circuit elements 355 are placed on first dielectric layer 335 between functional circuit elements 345. The functional circuit elements 345 and the filler circuit elements 355 on first dielectric layer 335 are then covered with a second dielectric layer 365. Filler circuit elements 355 provide support for second dielectric layer 365 in areas in which functional circuit elements 345 are not present.

In an advantageous embodiment of the present invention, second dielectric layer 360 and second dielectric layer 365 are applied and then planarized to create a flat external surface on second dielectric layer 360 and to create a flat external surface on second dielectric layer 365.

Second dielectric layer 360 and second dielectric layer 365 are applied in liquid form. Second dielectric layer 360 and second dielectric layer 365 are allowed to dry until they have solidified and are dry to touch. The external surface of second dielectric layer 360 is not flat due to the presence of the underlying functional circuit elements 340 and filler circuit elements 350. The external surface of second dielectric layer 365 is not flat due to the presence of the underlying functional circuit elements 345 and filler circuit elements 355.

Planarization plate 370 is then placed in contact with the uneven external surface of second dielectric layer 360 and planarization plate 375 is then placed in contact with the uneven external surface of second dielectric layer 365. Planarization plate 370 contains heating element 372 so that planarization plate 370 is capable of heating second dielectric layer 360. Planarization plate 375 contains heating element 377 so that planarization plate 375 is capable of heating second dielectric layer 365. In an alternate embodiment of the present invention, one or more heating elements may be provided that are separate from the planarization plates. For example, heating element 372 may be located outside of planarization plate 370 and heating element 377 may be located outside of planarization plate 375.

As planarization plate 370 presses second dielectric layer 360, the high portions (i.e., the elevated or protruding portions) of second dielectric layer 360 that are in contact with the surface of planarization plate 370 flatten and flow into the low portions or "valleys" in the surface of second dielectric layer 360. In this manner the high portions of second dielectric layer 360 fill up the low portions of second dielectric layer 360 so that a flat external surface may be formed on second dielectric layer 360.

The location of planarization plate 370 with respect to the external surface of second dielectric layer 360 is controlled by a conventional control mechanism (not shown) so that the surface 380 of planarization plate 370 may extend to but not extend beyond a control gap position (indicated in FIG. 3 by dotted line 390). The location of the control gap position is chosen to select the final thickness of second dielectric layer 360. That is, the location of the control gap position will coincide with the final external surface of second dielectric layer 360.

Similarly, as planarization plate 375 presses second dielectric layer 365, the high portions of second dielectric layer 365 that are in contact with the surface of planarization plate 375 flatten and flow into the low portions or "valleys" in the surface of second dielectric layer 365. In this manner the high portions of second dielectric layer 365 fill up the low portions of second dielectric layer 365 so that a flat external surface may be formed on second dielectric layer 365.

The location of planarization plate 375 with respect to the external surface of second dielectric layer 365 is controlled by a conventional control mechanism (not shown) so that the surface 385 of planarization plate 375 may extend to but not extend beyond a control gap position (indicated in FIG. 3 by dotted line 395). The location of the control gap position is chosen to select the final thickness of second dielectric layer 365. That is, the location of the control gap position will coincide with the final external surface of second dielectric layer 365.

The two planes represented by dotted line 390 and by dotted line 395 are kept parallel with the surface area of SBU substrate 300 by conventional machine shop adjustment techniques.

As planarization plate 370 heats second dielectric layer 360, the dielectric material within second dielectric layer 360 flattens and hardens to form a flat external surface with respect to surface 380 of planarization plate 370. As planarization plate 375 heats second dielectric layer 365, the dielectric material within second dielectric layer 365 flattens and hardens to form a flat external surface with respect to surface 385 of planarization plate 375.

Planarization plate 370 is removed and the second dielectric layer 360 is allowed to cool. Alternatively, the heating element 372 of planarization plate 370 is turned off and the second dielectric layer 360 is allowed to cool while second dielectric layer 360 remains in contact with surface 380 of planarization plate 370. This sets a uniform thickness for second dielectric layer 360 in accordance with the location of the control gap position 390 as previously described.

Similarly, planarization plate 375 is removed and the second dielectric layer 365 is allowed to cool. Alternatively, the heating element 377 of planarization plate 375 is turned off and the second dielectric layer 365 is allowed to cool while second dielectric layer 365 remains in contact with surface 385 of planarization plate 375. This sets a uniform thickness for second dielectric layer 365 in accordance with the location of the control gap position 395 as previously described.

It is understood that planarization plate 370 and planarization plate 375 may simultaneously be placed in contact with their respective second dielectric layers 360 and 365. In this manner the top and bottom surfaces of substrate 300 may be simultaneously planarized.

In an advantageous embodiment of the present invention, surface 380 of planarization plate 370 (and surface 385 of planarization plate 375) is machined to a high degree of flatness and sand blasted to a high degree of smoothness. In an additional advantageous embodiment of the present invention, a layer of non-stick material (e.g., Teflon) may be applied to the surface 380 of planarization plate 370 and to the surface 385 of planarization plate 375. Alternatively, other techniques may be used such as impregnating surface 380 of planarization plate 370 and surface 385 of planarization plate 375 with non-stick material.

Figure 4:
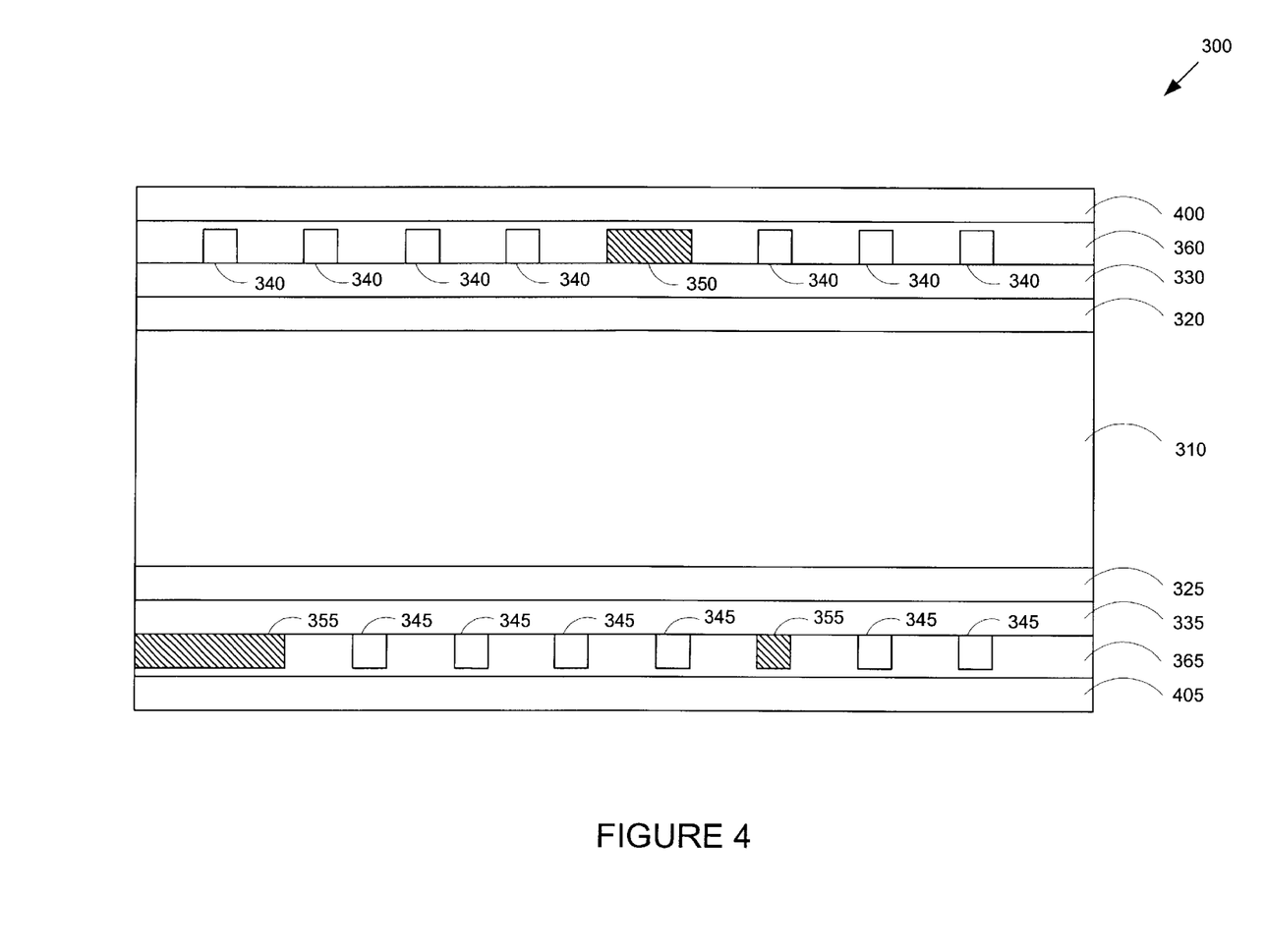
FIG. 4 illustrates a sectional side view of an advantageous embodiment of a sequential build up substrate of the present invention showing flat external surfaces of the substrate.

FIG. 4 illustrates a sectional side view of an advantageous embodiment of SBU substrate 300 of the present invention showing the result of applying an advantageous embodiment of the method of the present invention. SBU substrate 300 comprises second dielectric layer 360 having a flat exterior surface and second dielectric layer 365 having a flat exterior surface. A third metal conductor layer 400 has been applied to the flat exterior surface of second dielectric layer 360 and a third metal conductor layer 405 has been applied to the flat exterior surface of second dielectric layer 365.

Unlike prior art SBU substrates, SBU substrate 300 of the present invention comprises third metal conductor layers, 400 and 405, that have flat external surfaces. The flatness of the external surfaces permits the third metal conductor layers, 400 and 405, to be etched to finer geometries than is possible in prior art SBU substrates that have layers with uneven external surfaces.

The process described above may be repeated to add more layers. By planarizing each dielectric layer after each metal etch process, the external surface of the next deposited layer will be flatter than flat surfaces that may be achieved by prior art methods and can therefore be etched to finer geometries.

Figure 5:
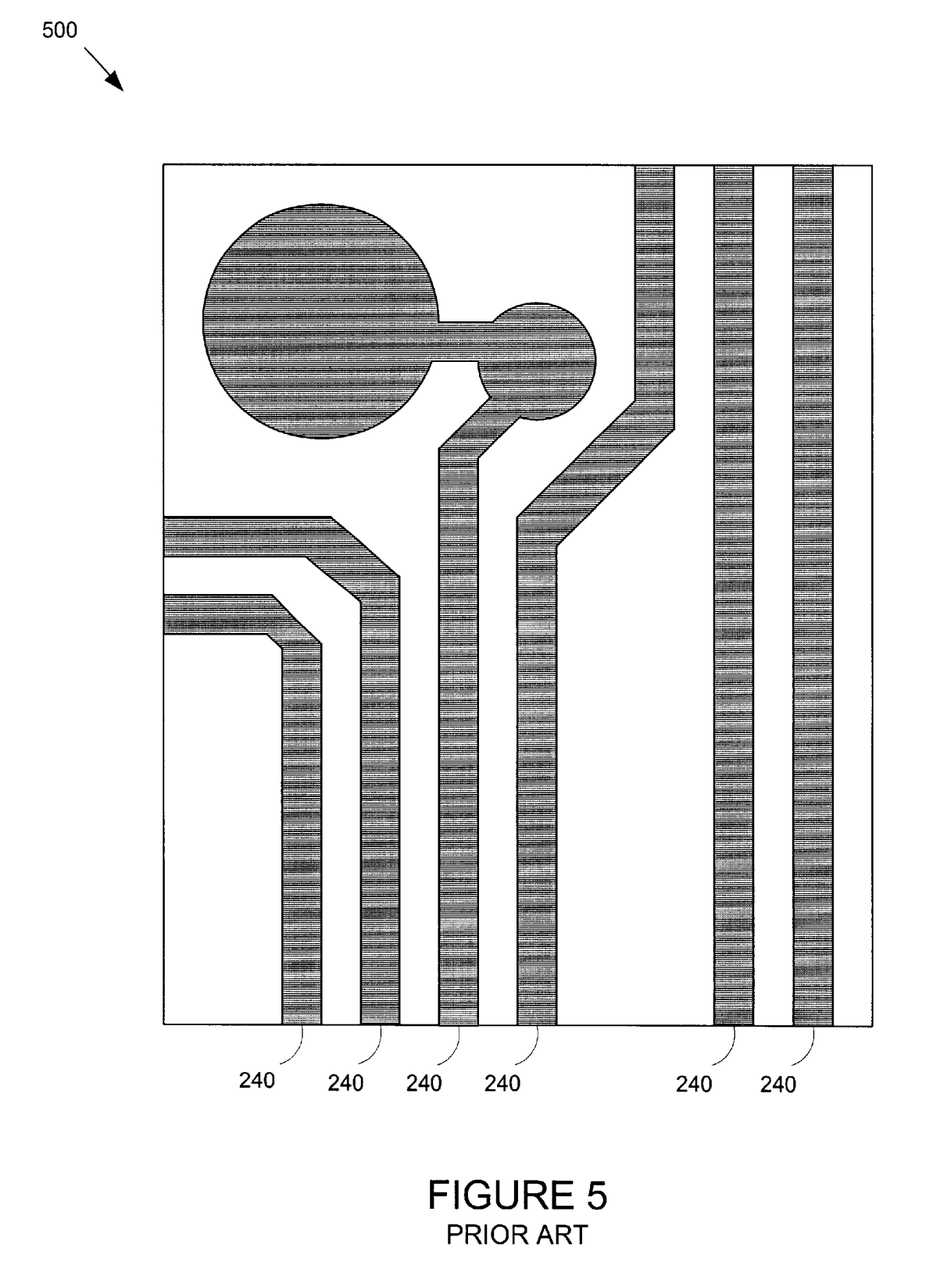
FIG. 5 illustrates a plan view of a portion of an exemplary prior art substrate showing the placement of exemplary functional circuit elements on a substrate.

FIG. 5 illustrates a plan view of a portion 500 of an exemplary prior art SBU substrate 200 showing an exemplary substrate design. Functional circuit elements 240 of SBU substrate 200 are arranged in the exemplary substrate design as shown in FIG. 5. The functional circuit elements 240 are represented by the dark shaded areas of portion 500. The substrate design of FIG. 5 has a number of flat low areas or spaces between functional circuit elements 240. These flat low areas or spaces create uneven "gaps" between functional circuit elements 240. It is the presence of these "gaps" that create uneven surfaces during a sequential build up process in prior art SBU substrates.

Figure 6:
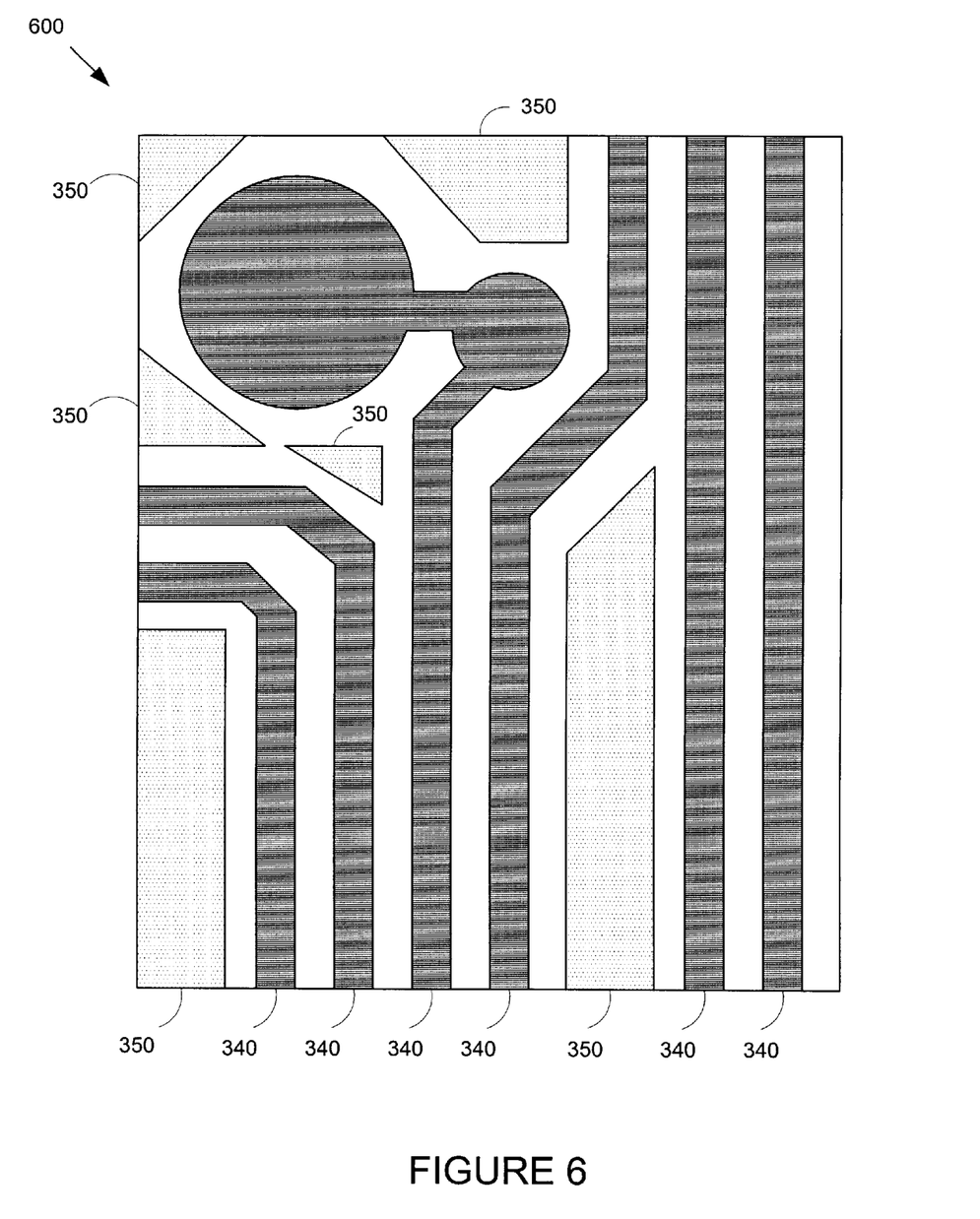
FIG. 6 illustrates a plan view of a portion of an exemplary substrate of the present invention showing the placement of filler circuit elements between functional circuit elements of the substrate design shown in FIG. 4.

FIG. 6 illustrates a plan view of a portion 600 of SBU substrate 300 of the present invention showing a substrate design identical to that shown in FIG. 5. The functional circuit elements 340 are represented by the dark shaded areas of portion 600. FIG. 6 also shows the placement of filler circuit elements 350 between functional circuit elements 340 of the present invention. The filler circuit elements 350 are represented by the light shaded areas of portion 600. The presence of filler circuit elements 350 between circuit elements 340 eliminates the "gaps" that would otherwise create uneven surfaces during the sequential build up process.

Figure 7:
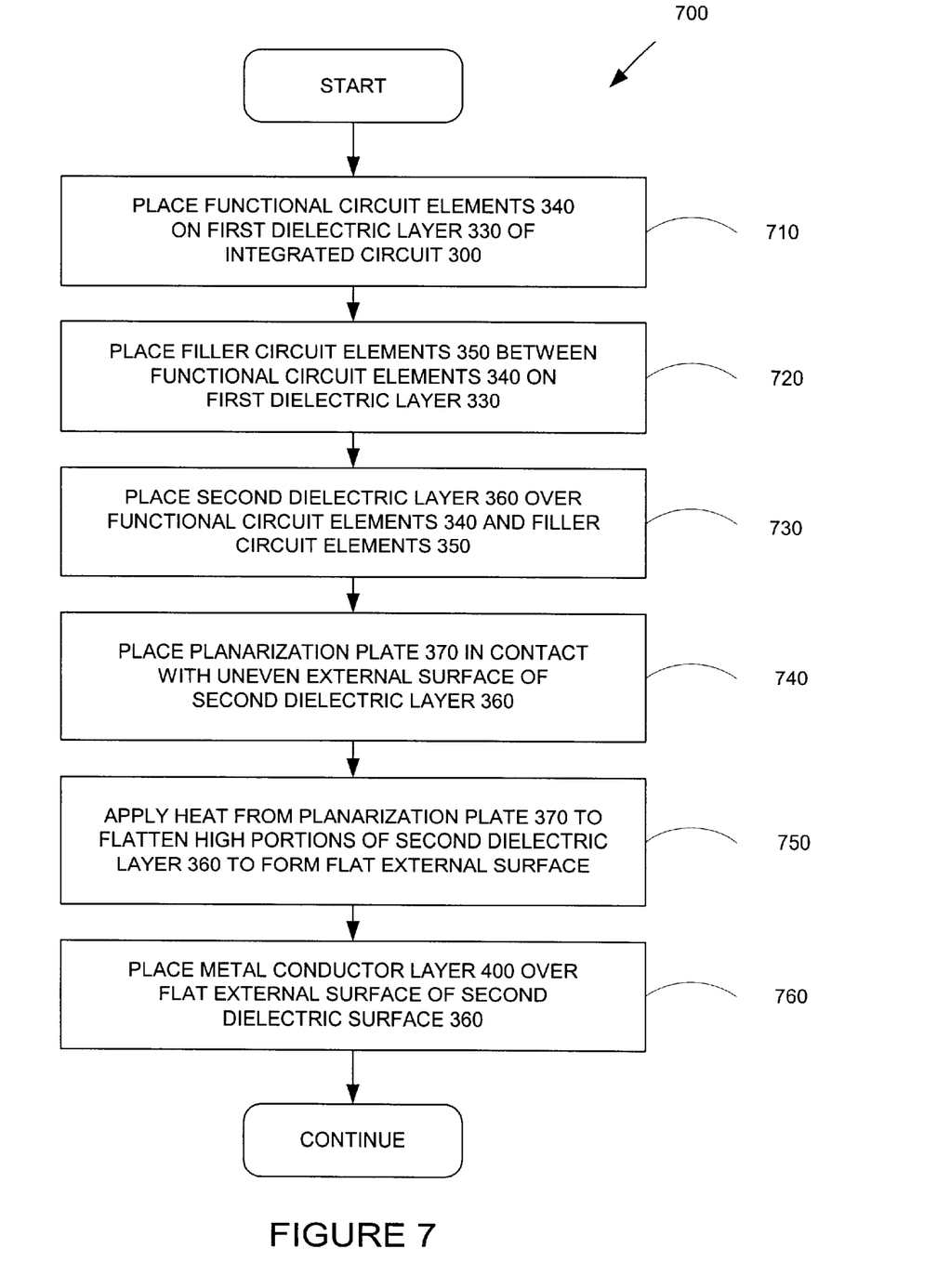
FIG. 7 illustrates a flow chart of an advantageous embodiment of a method of the present invention for providing mechanical planarization of a sequential build up substrate for an integrated circuit package.

FIG. 7 illustrates a flow chart of an advantageous embodiment of a method of the present invention for providing mechanical planarization of a sequential build up substrate for an integrated circuit package. The steps of the method are generally denoted with reference numeral 700.

This description of the method assumes that first metal conductor layer 320 and first dielectric layer 330 have already been placed on underlying core substrate 310 of SBU substrate 300. Functional circuit elements 340 are then placed on the surface of first dielectric layer 330 (step 710). Filler circuit elements 350 are then placed between the functional circuit elements 340 on the surface of first dielectric layer 330 (step 720). Then second dielectric layer 360 is placed over functional circuit elements 340 and filler circuit elements 350 (step 730). As previously described, the external surface of second dielectric layer 360 is uneven (i.e., not flat) due to the presence of functional circuit elements 340 and filler circuit elements 350.

Then planarization plate 370 is placed in contact with the uneven external surface of second dielectric layer 360 (step 740). Heat from planarization plate 370 is then applied to the uneven external surface of second dielectric layer 360 to flatten the high portions of the second dielectric layer 360 to form a flat external surface (step 750). Lastly, metal conductor layer 400 is placed over the flat external surface of second dielectric surface 360 (step 760). This causes metal conductor layer 400 to have a flat external surface.

The steps of the method may be repeated to add additional sequential build up layers to SBU substrate 300.

Although the present invention has been described in detail, those skilled in the art will understand that various changes, substitutions, and alterations herein may be made without departing from the spirit and scope of the invention it its broadest form.

What is claimed is:

1. A sequential build up substrate comprising:

a first dielectric layer;

functional circuit elements placed on said first dielectric layer;

filler circuit elements placed between said functional circuit elements on said first dielectric layer; and a second dielectric layer placed over said functional circuit elements and said filler circuit elements and said first dielectric layer wherein said second dielectric layer has a flat external surface formed by flattening high portions of said second dielectric layer to cause said high portions of said second dielectric layer to fill up low portions of said second dielectric layer.

2. The sequential build up substrate as set forth in claim 1 further comprising a metal conductor layer placed over said flat external surface of said second dielectric layer.

3. The sequential build up substrate as set forth in claim 2 wherein said metal conductor layer has a flat external surface.

4. The sequential build up substrate as set forth in claim 1 comprising a plurality of sequential build up layers where each sequential build up layer comprises:

a first dielectric layer;

functional circuit elements placed on said first dielectric layer;

filler circuit elements placed between said functional circuit elements on said first dielectric layer;

a second dielectric layer placed over said functional circuit elements and said filler circuit elements and said first dielectric layer wherein said second dielectric layer has a flat external surface formed by flattening high portions of said second dielectric layer to cause said high portions of said second dielectric layer to fill up low portions of said second dielectric layer; and a metal conductor layer placed over said flat external surface of said second dielectric layer.

5. A sequential build up substrate comprising:

a core substrate;

a first dielectric layer on a first side of said core substrate;

a first set of functional circuit elements placed on said first dielectric layer;

a first set of filler circuit elements placed between said first set of functional circuit elements on said first dielectric layer;

a second dielectric layer on a second side of said core substrate;

a second set of functional circuit elements placed on said second dielectric layer;

a second set of filler circuit elements placed between said second set of functional circuit elements on said second dielectric layer;

a third dielectric layer placed over said first set of functional circuit elements and over said first set of filler circuit elements and over said first dielectric layer wherein said third dielectric layer has a flat external surface; and a fourth dielectric layer placed over said second set of functional circuit elements and over said second set of filler circuit elements and over said second dielectric layer wherein said fourth dielectric layer has a flat external surface.

6. The sequential build up substrate as set forth in claim 5 further comprising:

a first metal conductor layer placed over said flat external surface of said third dielectric layer; and a second metal conductor layer placed over said flat external surface of said fourth dielectric layer.

7. The sequential build up substrate as set forth in claim 6 wherein said first metal conductor layer has a flat external surface; and wherein said second metal conductor layer has a flat external surface.

8. The sequential build up substrate as set forth in claim 5 comprising a plurality of sequential build up layers on a first side of said core substrate and a plurality of sequential build up layers on a second side of said core substrate, where each sequential build up layer comprises:

a first dielectric layer;

functional circuit elements placed on said first dielectric layer;

filler circuit elements placed between said functional circuit elements on said first dielectric layer;

a second dielectric layer placed over said functional circuit elements and said filler circuit elements and said first dielectric layer wherein said second dielectric layer has a flat external surface; and a metal conductor layer placed over said flat external surface of said second dielectric layer.

9. In a sequential build up substrate of the type comprising functional circuit elements placed on a first dielectric layer, a method for placing over said functional circuit elements a second dielectric layer having a flat external surface, said method comprising the steps of:

placing filler circuit elements on said first dielectric layer between said functional circuit elements;

placing a second dielectric layer over said functional circuit elements and over said filler circuit elements and over said first dielectric layer;

placing a surface of a planarization plate in contact with an external surface of said second dielectric layer;

heating said external surface of said second dielectric layer to flatten portions of said external surface of said second dielectric layer; and cooling said second dielectric layer to form a flat external surface on said second dielectric layer.

10. The method as set forth in claim 9 further comprising the step of:

placing a metal conductor layer over said flat external surface of said second dielectric layer.

11. The method as set forth in claim 10 wherein said metal conductor layer has a flat external surface.

12. The method as set forth in claim 9 further comprising the steps of:

moving said planarization plate toward a control gap limit as said portions of said second dielectric layer flatten; and causing said planarization plate to cease moving when said surface of said planarization plate that is in contact with said external surface of said second dielectric layer reaches said control gap limit.

13. The method as set forth in claim 9 wherein said step of heating said external surface of said second dielectric layer to flatten portions of said external surface of said second dielectric layer comprises the step of:

heating said external surface of said second dielectric layer with a heating element located within said planarization plate.

14. In a sequential build up substrate of the type comprising a first set of functional circuit elements placed on a first dielectric layer on a first side of a core substrate and a second set of functional circuit elements placed on second dielectric layer on a second side of said core substrate, a method for placing over said first set of functional circuit elements a third dielectric layer having a flat external surface and placing over said second set of functional circuit elements a fourth dielectric layer having a flat external surface, said method comprising the steps of:

placing a first set of filler circuit elements on said first dielectric layer between circuit elements of said first set of functional circuit elements;

placing a second set of filler circuit elements on said second dielectric layer between circuit elements of said second set of functional circuit elements;

placing a third dielectric layer over said first set of functional circuit elements and over said first set of filler circuit elements and over said first dielectric layer;

placing a fourth dielectric layer over said second set of functional circuit elements and over said second set of filler circuit elements and over said second dielectric layer;

placing a surface of a first planarization plate in contact with an external surface of said third dielectric layer;

placing a surface of a second planarization plate in contact with an external surface of said fourth dielectric layer;

heating said external surface of said third dielectric layer to flatten portions of said external surface of said third dielectric layer;

heating said external surface of said fourth dielectric layer to flatten portions of said external surface of said fourth dielectric layer;

cooling said third dielectric layer to form a flat external surface on said third dielectric layer; and cooling said fourth dielectric layer to form a flat external surface on said fourth dielectric layer.

15. The method as set forth in claim 14 further comprising the steps of:

placing a first metal conductor layer over said flat external surface of said third dielectric layer; and placing a second metal conductor layer over said flat external surface of said fourth dielectric layer.

16. The method as set forth in claim 14 wherein said first metal conductor layer has a flat external surface and said second metal conductor layer has a flat external surface.

17. The method as set forth in claim 14 further comprising the steps of:

moving said first planarization plate toward a first control gap limit as said portions of said third dielectric layer flatten;

causing said first planarization plate to cease moving when said surface of said first planarization plate that is in contact with said external surface of said third dielectric layer reaches said first control gap limit;

moving said second planarization plate toward a second control gap limit as said portions of said fourth dielectric layer flatten; and causing said second planarization plate to cease moving when said surface of said second planarization plate that is in contact with said external surface of said fourth dielectric layer reaches said second control gap limit.

18. The method as set forth in claim 14 wherein said step of heating said external surface of said third dielectric layer to flatten portions of said external surface of said third dielectric layer comprises the step of:

heating said external surface of said third dielectric layer with a heating element located within said first planarization plate.

19. The method as set forth in claim 14 wherein said step of heating said external surface of said fourth dielectric layer to flatten portions of said external surface of said fourth dielectric layer comprises the step of:

heating said external surface of said fourth dielectric layer with a heating element located within said second planarization plate.

20. A method for providing mechanical planarization of a sequential build up package for an integrated circuit package of the type comprising functional circuit elements placed on a first dielectric layer, said method comprising the steps of:

placing filler circuit elements on said first dielectric layer between said functional circuit elements;

placing a second dielectric layer over said functional circuit elements and over said filler circuit elements;

placing a surface of a planarization plate in contact with an external surface of said second dielectric layer;

heating said external surface of said second dielectric layer to flatten portions of said external surface of said second dielectric layer;

moving said planarization plate toward a control gap limit as said portions of said second dielectric layer flatten;

causing said planarization plate to cease moving when said surface of said planarization plate that is in contact with said external surface of said second dielectric layer reaches said control gap limit;

cooling said second dielectric layer to form a flat external surface on said second dielectric layer; and placing a metal conductor layer over said flat external surface of said second dielectric layer, said metal conductor layer having a flat external surface.

21. The method as set forth in claim 20 further comprising the step of:

creating a plurality of mechanically planarized sequential build up packages in said sequential build up substrate by repeating the steps of claim 20 for each mechanically planarized sequential build up package created in said sequential build up substrate.

* * * * *